United States Patent
Bai et al.

[11] Patent Number: 5,861,340
[45] Date of Patent: *Jan. 19, 1999

[54] METHOD OF FORMING A POLYCIDE FILM

[75] Inventors: Gang Bai, San Jose; David B. Fraser, Danville, both of Calif.

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 602,126

[22] Filed: Feb. 15, 1996

[51] Int. Cl.$^6$ .................... H01L 21/283; H01L 21/336
[52] U.S. Cl. .................... 438/592; 438/594; 438/653; 438/655; 438/657
[58] Field of Search .................... 437/415 M, 190, 437/193, 195, 200; 438/592, 593, 594, 649, 653, 655, 657, 683, 684; 257/413

[56] References Cited

U.S. PATENT DOCUMENTS

| | | | |
|---|---|---|---|
| 5,164,333 | 11/1992 | Schwalke et al. | 437/200 |
| 5,350,698 | 9/1994 | Huang et al. | 438/592 |
| 5,470,772 | 11/1995 | Woo | 438/594 |
| 5,543,362 | 8/1996 | Wu | 437/200 |
| 5,597,751 | 1/1997 | Wang | 437/43 |

OTHER PUBLICATIONS

Hu, C., et al., Diffusion Barrier Studies for Cu, Jun. 9–10, 1986, VMIC Conf., pp. 181–187.
Ghandhi, S., VLSI Fabrication Principles, John Wiley & Son, 1983, pp. 427–430.
Wolf., S., Silicon Processing, vol. 1, 1986, Lattice Press, pp. 175–180, 397–399.
Murarka, S.P., Refractory Silicides for Integrated Circuits, J. Vac. Sci. Technol., 17(4), Jul./Aug. 1980, pp. 775–792.
Wolf., S., Silicon Processing, vol. 3, 1995, Lattice Press, pp. 228–231, 616–621.
Ghandhi, S. K., VLSI Fabrication, John Wiley & Sons, 1983, pp. 371–373.
Sheng et al., Coss–Sectional Transmission . . . in Materials and Process Characterization for VLSI 1988, Zony et al., Editors, World Scientific, pp. 474–475.

*Primary Examiner*—T. N. Quach
*Attorney, Agent, or Firm*—Blakely, Sokoloff, Taylor & Zafman

[57] ABSTRACT

A method of forming a polycide thin film. First, a silicon layer is formed. Next, a thin barrier layer is formed on the first silicon layer. A second silicon layer is then formed on the barrier layer. Next, a metal layer is formed on the second silicon layer. The metal layer and the second silicon layer are then reacted together to form a silicide.

24 Claims, 5 Drawing Sheets

METHOD OF FORMING A POLYCIDE FILM

BACKGROUND OF THE INVENTION

1. Field of the Invention

The present invention relates to the field of semiconductor thin films; and more particularly to novel polycide thin films and their methods of fabrication.

2. Discussion of Related Art

Polycrystalline silicon (polysilicon) is a thin film which has been widely used in semiconductor manufacturing. Polysilicon lines have been used as gate electrodes, interconnects, and capacitors in integrated circuits. Polysilicon, however, has been somewhat limited by its high bulk resistivity. Polycide films which consist of a low resistance silicide formed on a doped polysilicon film have been used in place of polysilicon in an attempt to decrease the resistance of gate electrodes and interconnects to thereby create faster and lower power consuming integrated circuits.

A current method of fabricating a polycide gate electrode utilizing a self-aligned silicide (salicide) process is illustrated in FIGS. 1a–1c. According to a standard salicide process, a conventional transistor, such as the N-channel metal oxide semiconductor field effect transistor (NMOSFET) shown in FIG. 1a is provided. NMOS transistor 100 has a polysilicon gate electrode 104 formed on a gate dielectric 102 which in turn is formed on a p-type monocrystalline silicon substrate 101. Spacers 106 are formed adjacent to and run along opposite sidewalls of polysilicon gate electrode 104. N– source/drain tip regions 108 and N+ source/drain contact regions 110 are formed into substrate 101 in alignment with polysilicon gate electrode 104 and sidewall spacers 106, respectively.

In order to reduce the resistance of polysilicon gate electrode 104 and source/drain contact regions 110, a metal layer 112 such as titanium, is blanket deposited over substrate 101, as shown in FIG. 1b. Substrate 101 is then annealed to cause a reaction between titanium layer 112 and exposed silicon on polysilicon gate electrode 104 and source/drain contact regions 110 to form low resistance titanium-silicide (TiSi$_x$ wherein X≈2) 114. No silicide reaction occurs on spacers 106 because no silicon is available for reaction with titanium. Next, as shown in FIG. 1c, unreacted titanium is removed from spacers 106 with an etchant which preferentially etches titanium as opposed to titanium-silicide. The result is a low resistance silicide 114 which has been selectively formed on the source/drain contact regions 110 and on the top of polysilicon gate electrode 104.

A problem with the silicide process described above is that it cannot be reliably used to form silicides on narrow polysilicon gate electrodes (i.e. gate lengths less than 0.25 $\mu$m). During the annealing of substrate 101, silicon and titanium first react to form what is known as C-49 titanium-silicide. C-49 titanium-silicide has a relatively high resistance and must subsequently be converted into C-54 titanium-silicide which has a substantially lower resistance. C-49 titanium-silicide is converted into C-54 titanium-silicide by initiating the formation of a C-54 nucleation site or island from which the remainder of the C-49 film can convert into C-54 titanium-silicide. As gate lengths decrease, higher C-54 nucleation densities are required in order to ensure the formation of a C-54 nucleation site on the gate electrode so that the remainder of the C-49 titanium-silicide on the gate electrode can convert into C-54 titanium-silicide. Nucleation density is increased by increasing the annealing temperature of the silicide process. Thus, as gate electrode dimensions decrease, anneal temperatures must increase in order to provide a high enough nucleation density to insure that a low resistance silicide can be formed on narrow lines.

Unfortunately, however, at high anneal temperatures, silicides become unstable and begin to agglomerate or "bubble" 116 which causes dislocations and discontinuities 118 in the silicide. FIG. 1d is an illustration of the agglomeration of a silicide viewed along the "width" of a gate electrode. Dislocations and discontinuities 118 in a silicide on a gate electrode can cause a substantial increase in the resistance of the gate electrode which reduces device performance and basically defeats the purpose of forming a silicide in the first place.

As such, the silicide process described above has a thermal window in which a low resistance and uniform polysilicide film can be reliably formed. The silicide process must exceed a minimum temperature in order to provide a high enough nucleation density to ensure the formation of a low resistance silicide on narrow gate electrodes (or polysilicon lines), and must remain below a maximum temperature in order to prevent silicide agglomeration. Thus, as polysilicon gate lengths decrease to fabricate higher density integrated circuits, (i.e. as polysilicon lines become narrower), the thermal window will become so small that uniform, low resistance silicides can no longer be manufacturably fabricated with such a process.

Thus, what is needed is a method of increasing the thermal stability of silicide films.

SUMMARY OF THE INVENTION

Novel polycide thin films and their methods of fabrication are described. According to the preferred embodiment of the present invention, a first silicon layer is formed. Next, a barrier layer is formed on the first silicon layer. A second silicon layer is then formed on the barrier layer. Next, a metal layer is formed on the second silicon layer. A silicide film is then formed by reacting the metal layer with the second silicon layer.

BRIEF DESCRIPTION OF THE DRAWINGS

FIG. 1b is an illustration of a cross-sectional view showing the blanket deposition of a metal over the substrate of FIG. 1a.

FIG. 2b is an illustration of the formation of a transistor and a metal layer on the substrate of FIG. 2a.

DETAILED DESCRIPTION OF THE PRESENT INVENTION

Figure 1A:
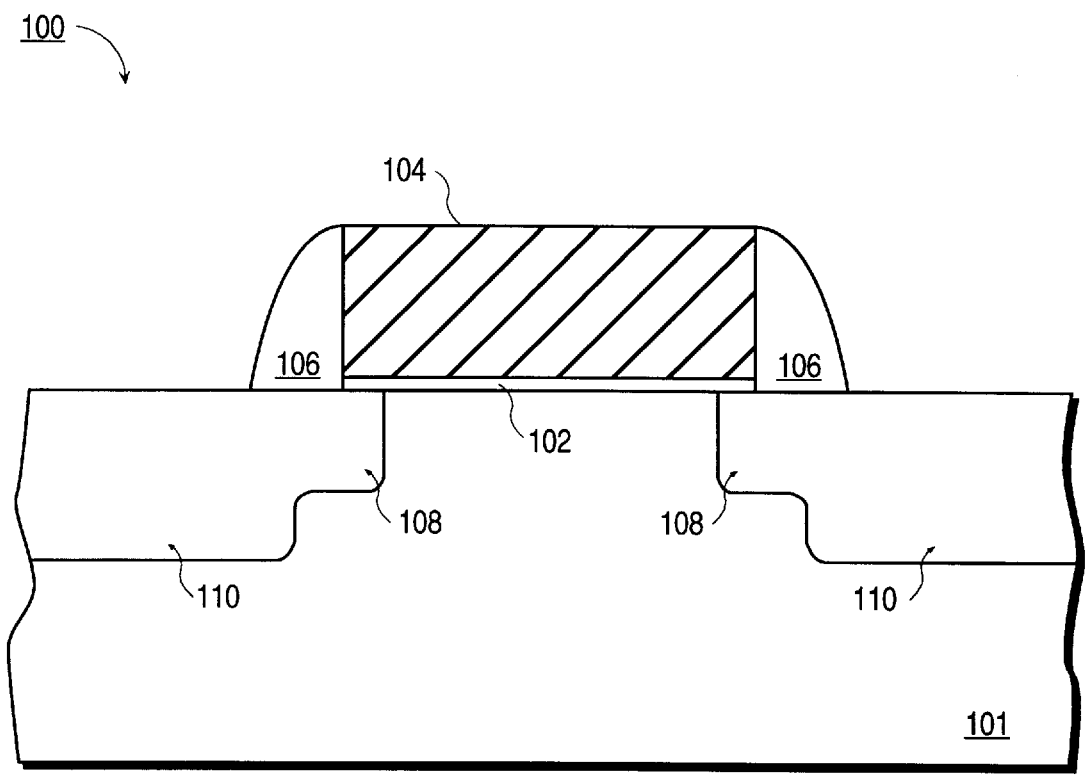
FIG. 1a is an illustration of a cross-sectional view showing a MOS transistor with a polysilicon gate electrode.
Figure 1B:
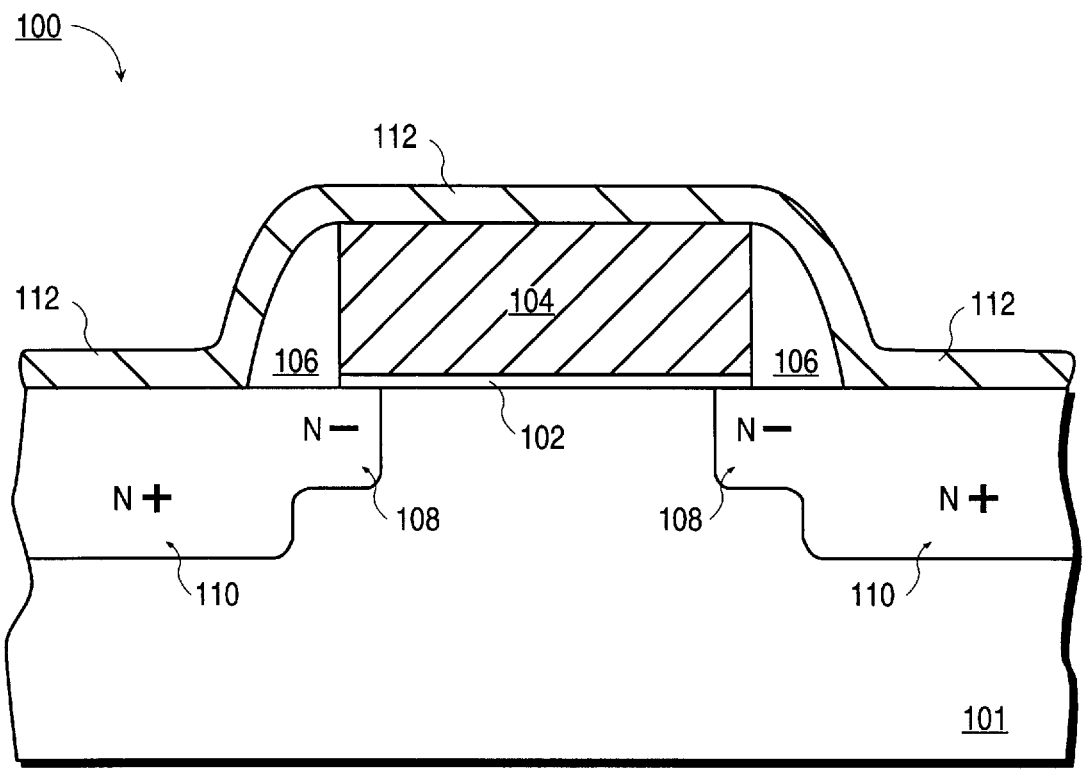
Figure 1C:
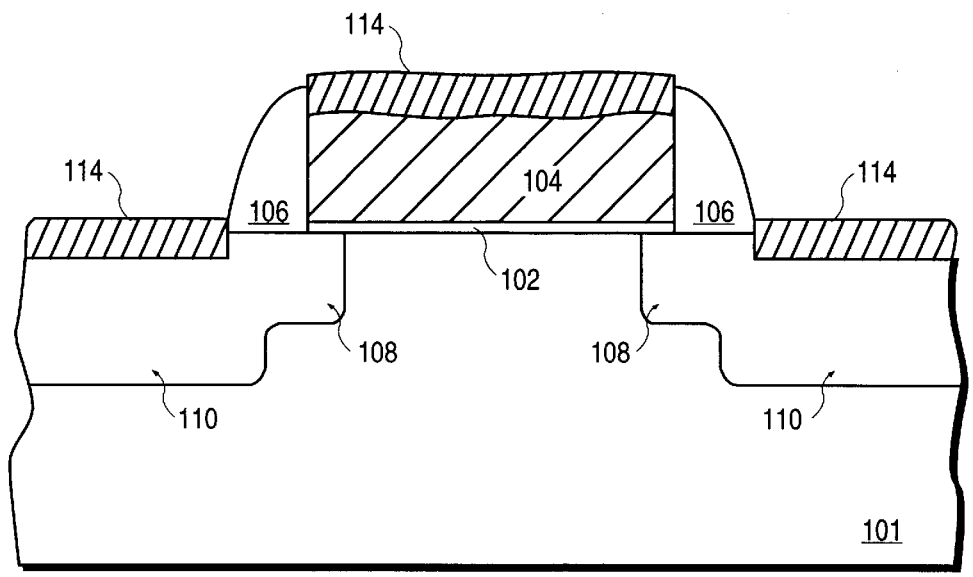
FIG. 1c is an illustration of a cross-sectional view showing the formation of silicide on the substrate of FIG. 1c.
Figure 1D:
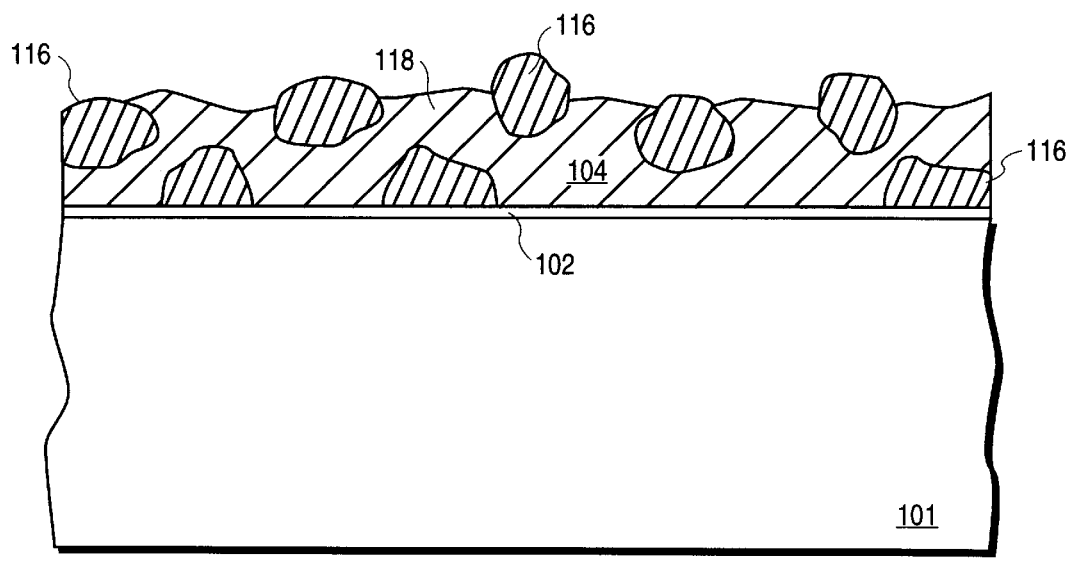
FIG. 1d is an illustration of a cross-sectional view showing the agglomeration of a silicide.

Novel polycide thin films having increased thermal stability and their methods of fabrication are described. In the following description, numerous specific details are set forth such as specific materials, thicknesses, and process parameters, in order to provide a thorough understanding of the present invention. It will be obvious, however, to one skilled in the art that the present invention may be practiced without these specific details. In other instances, well known semiconductor processes and machinery have not been described in particular detail in order to avoid unnecessarily obscuring the present invention.

The present invention is a method of forming a low resistance silicide with increased thermal stability on a polysilicon line. The present invention utilizes a silicon stack with a thin oxide barrier layer sandwiched between two silicon layers. A metal layer is then deposited onto the top silicon layer and is then annealed with the top silicon layer to form a low resistance silicide. The thin oxide barrier layer prevents diffusion of silicon atoms from the lower silicon layer into the silicide and thereby prevents agglomeration of the silicide during high temperature annealing. By utilizing a thin oxide barrier layer, the formed silicide layer has increased thermal stability and so can be subjected to higher anneal and processing temperatures without agglomerating. By increasing the thermal stability of the silicide, higher anneal temperatures can be utilized which increases the nucleation density of the silicide which in turn enables a reliable silicidation of thin polysilicon lines (less than 0.25 $\mu$m) necessary for fabricating future ultra large scale integrated (ULSI) circuits.

The present invention is described with respect to a preferred embodiment wherein a silicide is formed on a silicon gate electrode in a self-aligned silicide (salicide) process. It is to be appreciated that the present invention is equally applicable to any process wherein silicon lines are silicided, such as but not limited to, the formation of interconnects, emitters, capacitors, and contacts.

According to the preferred embodiment of the present invention, a monocrystalline silicon substrate 200 doped to a desired conductivity level and type is provided. Substrate 200 may include a plurality of wells or epitaxial layers of different conductivity types in order to allow the processing of complementary metal oxide semiconductor (CMOS) integrated circuits. Additionally, substrate 200 need not necessarily be a silicon substrate and may be other types of substrates, such as but not limited to, silicon-germanium. A thin gate dielectric layer 202 is formed by well known techniques over substrate 200.

Next, a silicon layer 204 is formed over gate dielectric 202. Silicon layer 204 is preferably polycrystalline silicon (polysilicon), but can be an amorphous silicon layer, if desired. Silicon film 204 is preferably formed to a thickness which is the desired thickness of the polysilicon portion of the polycide line to be fabricated. For example, if a 2500 angstroms (Å) polycide film is desired, with a 2000 Å polysilicon layer and 500 Å silicide layer, then silicon layer 204 is formed to a thickness of approximately 2000 Å. Silicon layer 204 can take on any thickness if desired, but will typically be between 500–3000 Å thick. Silicon film 204 can be formed by any well known technique, such as by chemical vapor deposition (CVD), at a temperature between 600°–700° C. utilizing a gas chemistry comprising silane or dichlorosilane and $H_2$. Silicon layer 204 can be insitu doped, if desired, however, it is preferred to dope silicon layer 204 during the source/drain doping of the transistor in order to simplify the manufacturing of CMOS circuits.

Next, a thin barrier layer 206 is blanket deposited onto silicon layer 204. Barrier layer 206 is preferably an oxide layer formed to a thickness between 5–25 Å, with 10–20 Å being preferred. Oxide barrier layer 206 is formed thick enough to prevent or retard silicon diffusion during subsequent high temperature processing, but yet is formed thin enough so as not to detrimentally affect the resistance of the polycide film. According to the preferred embodiment of the present invention, oxide barrier layer 206 is formed by removing substrate 200 from the silicon deposition chamber and exposing silicon layer 204 to an air ambient for approximately one hour. It is to be appreciated however, that any well known technique, which can form a thin uniform and high integrity oxide layer, such as a furnace anneal can be used.

Although barrier layer 206 is preferably a thin oxide layer, barrier layer 206 need not necessarily be an oxide. For example, barrier layer can be a passivating layer, such as but not limited to, silicon nitride and oxynitrides. Additionally, barrier layer 206 can be a thin metal layer, such as but not limited to, titanium-nitride, and tantalum-nitride, if desired. Barrier layer 206 should be able to sufficiently retard silicon diffusion from silicon layer 204 into a silicide layer formed above in order to prevent silicide agglomeration during subsequent high temperature silicide annealing and processing. Additionally, dopants, such as boron (B) and arsenic (As), should, if necessary, be able to easily diffuse through barrier layer 206 during a subsequent doping of the gate electrode. Additionally, barrier layer 206 should not detrimentally affect the desired resistivity of the polycide film. An oxide barrier layer 206 is preferred because a thin, high integrity barrier layer can be easily formed without affecting manufacturing costs or wafer throughput.

Figure 2A:
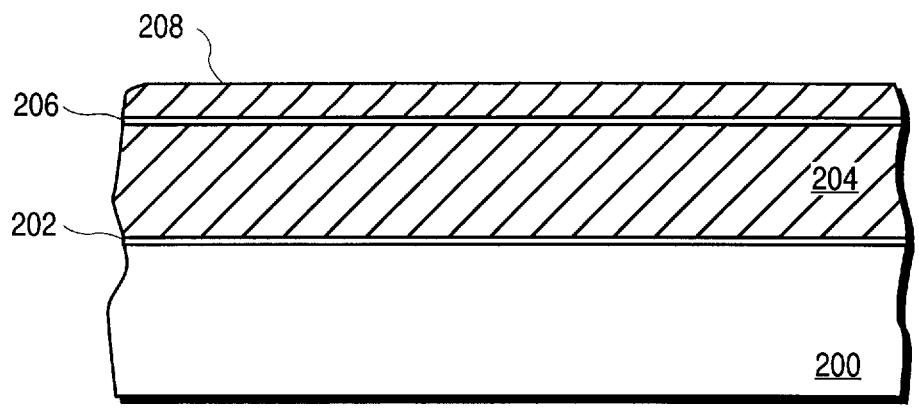
FIG. 2a is an illustration of a cross-sectional view showing the formation of a gate dielectric, a first silicon layer, a thin barrier layer, and a second silicon layer on a semiconductor substrate.

Next, a second silicon layer 208 is deposited onto barrier layer 206, as shown in FIG. 2a. Silicon layer 208 is preferably polysilicon, but may be amorphous silicon, if desired. Second silicon layer 206 is preferably formed to a thickness sufficient to supply all of the necessary silicon atoms required to form a silicide of a desired thickness and resistivity. Silicon film 208 is preferably completely consumed during the silicide reaction. Thus, the thickness of silicon layer 208 is dependent upon the desired thickness of the silicide portion of the polycide line and upon the type of silicide to be formed (i.e. cobalt-silicide, palladium-silicide, titanium-silicide, platinum-silicide, etc.) For example, for a 500 Å thick cobalt-silicide ($CoSi_2$) film, an approximately 500 Å thick silicon layer would be deposited, for an approximately 500 Å thick titanium-silicide ($TiSi_2$) film, an approximately 470 Å thick silicon layer 208 would be deposited, for an approximately 500 Å thick nickel-silicide (NiSi) film, an approximately 410 Å thick silicon layer 208 would be deposited, for an approximately 500 Å palladium-silicide ($Pd_2Si$) film, an approximately 240 Å thick silicon layer 208 would be deposited, and for an approximately 500 Å platinum-silicide (PtSi) film, an approximately 335 Å silicon layer 208 would be deposited. Silicon layer 208 can be formed by any well known method such as the CVD method described above.

Next, well known photolithography techniques are used to mask, expose, and develop a photoresist layer to define a location where a gate electrode is to be formed. Silicon layer 204, oxide barrier layer 206, and silicon layer 208 are then etched in alignment with the patterned photoresist layer by well known techniques, such as reactive ion etching (RIE) with a chemistry comprising fluorine and chlorine, to form a gate electrode 210, shown in FIG. 2b. At this time, conventional fabrication techniques are used to form source/drain regions of the transistor and to dope polysilicon gate electrode 210.

Figure 2B:
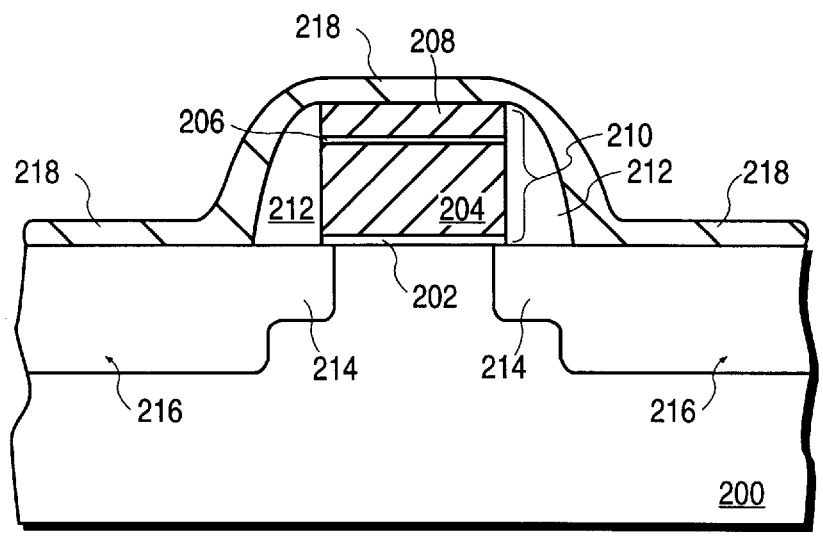

In a preferred method of forming source/drain regions, a pair of lightly doped source/drain regions 214 are formed by ion implanting impurities of opposite conductivity type to that of substrate 200 into substrate 200 in alignment with opposite sidewalls of gate electrode 210, as shown in FIG. 2b. Next, a pair of sidewall spacers 212 are formed on opposite sides of gate electrode 210. Sidewall spacers 212 can be formed by any well known technique such as by a blanket deposition followed by an antisotropic etch. Sidewall spacers are formed of an insulating material, such as but not limited to, silicon dioxide or silicon nitride. Heavily doped source/drain regions 216 are then formed by ion implanting impurities of opposite conductivity type to that of substrate 200 into substrate 200 in alignment with the outside edges of sidewall spacers 212, as shown in FIG. 2b. Subsequent annealing is used to activate and drive the impurities into substrate 200 and beneath gate electrode 210 and spacers 212, respectively.

It is to be noted that the source/drain implantation step is preferably used to dope polysilicon layers 208 and 204 of gate electrode 210 to decrease its electrical resistance. In this way, gate electrode 210 takes on the same conductivity type as the source/drain regions of the fabricated transistor. Doping polysilicon layers 204 and 208 during the source/drain formation steps, as opposed to during deposition, simplifies CMOS processing where both p-type and n-type transistors are fabricated on a single substrate. If the source/drain implants are used to dope polysilicon layer 204 and 208, barrier layer 206 should be formed of a material and to a thickness which allows diffusion of dopant impurities (typically arsenic and boron) through barrier layer 206 and into the lower silicon layer 204.

Next, a metal layer 218 is blanket deposited onto source/drain contact regions 216, sidewall spacers 212, and silicon layer 208 of gate electrode 210, as shown in FIG. 2b. Metal layer 218 is a metal, such as but not limited to, cobalt, titanium, palladium, platinum, and nickel, which can react with silicon to form a low resistance silicide. Metal layer 218 is preferably formed to a thickness which provides a sufficient number of metal atoms to substantially consume top polysilicon layer 202 and form a low resistance silicide.

For example, if a 500 Å cobalt-silicide film is desired, then an approximately 146 Å thick cobalt layer would be deposited onto a 500 Å thick silicon layer 208. If a 500 Å thick titanium-silicide film (TiSi$_2$) is desired, then an approximately 220 Å thick titanium layer would be deposited onto an approximately 470 Å thick silicon layer 208. If a 500 Å thick nickel-silicide (NiSi) film is desired, then an approximately 250 Å thick nickel layer would be deposited onto an approximately 410 Å thick silicon layer 208. If a 500 Å thick palladium-silicide (Pd$_2$Si) film is desired, then an approximately 360 Å thick palladium layer would be deposited onto an approximately 240 Å thick silicon layer 208, and if a 500 Å thick platinum-silicide (PtSi) film is desired, then an approximately 225 Å thick platinum layer would be deposited onto a 335 Å thick silicon layer 208. The above referenced silicon/metal thickness ratios can be utilized to generate thicker or thinner silicide layers as desired. Metal layer 218 is preferably formed by sputtering, however, other well known and suitable techniques such as CVD or evaporation may be used, if desired.

Figure 2C:
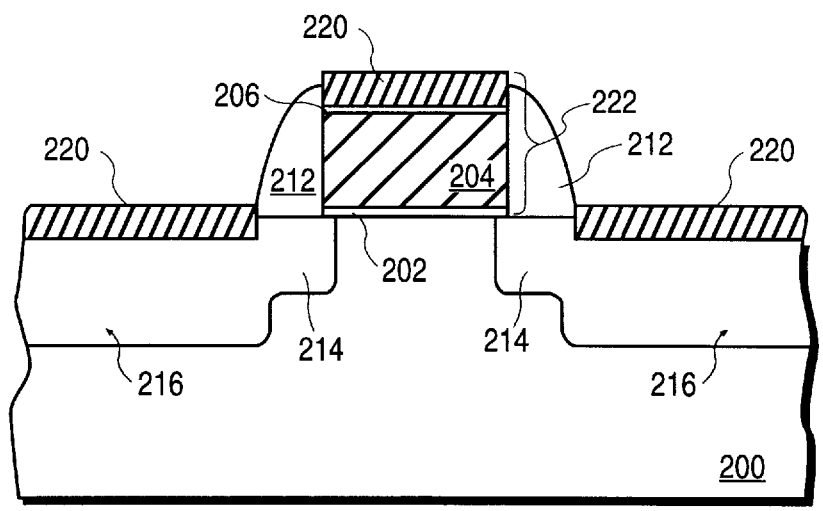
FIG. 2c is an illustration of the formation of a silicide on the substrate of FIG. 2b.

Next, substrate 200 is annealed to cause a reaction between silicon atoms in silicon layer 208 and metal layer 218 to form low resistance polycide gate electrode 222 and to cause a reaction between silicon atoms in source/drain contact regions 216 and metal layer 212 to form low resistance silicide contact regions, as shown in FIG. 2c. Substrate 200 can be annealed by any well known technique such as by a Rapid Thermal Process (RTP) or by a conventional furnace anneal. An RTP anneal is preferred because it reduces the thermal budget seen by the devices. If a titanium-silicide or a cobalt-silicide film is desired, then substrate 200 can be annealed in an AG Associates Rapid Thermal Processor at a temperature between 600°–900° C. in an inert ambient, such as nitrogen/argon, for approximately 20–30 seconds with five second ramp-up and ramp-down times. If a nickel-silicide, a palladium-silicide or a platinum-silicide film is desired, then substrate 200 can be annealed in an AG Associates Rapid Thermal Processor at a temperature between 400°–700° C. in an inert ambient for approximately 20–30 seconds with five second ramp-up and ramp-down times. It is to be noted that if silicon layer 204 is amorphous silicon, the silicide anneal step can be used to convert the amorphous silicon into low resistance polysilicon.

It is to be appreciated that, as shown in FIG. 2c, silicide 220 on the top of polycide gate electrode 222 is characterized by a very flat top surface and a very flat bottom interface. The thin barrier layer 206 prevents silicon atoms in bottom silicon layer 204 from diffusing into silicide 220 during high temperature processing and causing agglomeration of silicide 220. The incorporation of barrier layer 206 in polycide gate electrode 222 increases the thermal stability of silicide 220. By incorporating barrier layer 206 into polycide gate electrode 222, the thermal stability of silicide 220 on gate electrode 222 can be increased by more than 100° C. For example, titanium-silicide or cobalt-silicide films formed on polysilicon begin to agglomerate at approximately 800° C., but if barrier layer 206 is incorporated into the stack, agglomeration does not occur until over 900° C. Additionally, palladium-silicide, nickel-silicide, and platinum-silicide films formed on polysilicon begin to agglomerate at approximately 600° C., but when barrier layer 206 is incorporated into the stack, agglomeration does not occur until at least 700° C. By utilizing barrier layer 206, silicide anneal temperatures can be raised to increase the nucleation density of the silicide without causing silicide agglomeration. In this way, low resistance silicides can be uniformly and reliably formed on narrow (less than 0.25 $\mu$m) silicon lines to form polycide lines having a sheet resistance less than 5 Ω/square.

It is to be noted that a barrier layer is not needed to prevent silicide agglomeration on source/drain regions 216 because monocrystalline silicon is much more thermally stable than polycrystalline silicon and so excess silicon does not readily diffuse into silicide 220 on source/drain regions 216 and cause agglomeration. Additionally, it is to be noted that silicide does not form on spacers 212 because no silicon is available to react with metal layer 218. Unreacted metal on spacer 212 can be removed with an etchant which preferentially etches metal layer 218 with respect to silicide 220. In this way, a low resistance silicide 220 is self-aligned to the source, gate, and drain regions of the device. At this time, the self-aligned silicide process of the present invention is now complete.

It is to be appreciated that the present invention has been described and illustrated with respect to a preferred embodiment where a silicide is formed on a narrow polysilicon gate electrode in a self-aligned process. The present invention, however, is not to be limited to this preferred method and may be utilized anywhere silicon lines are silicided, such as in the formation of interconnects, capacitors, and contacts. Thus, the detailed description of the present invention is to be construed as illustrative rather than limiting where the scope of the present invention is to be determined by the appended claims which follow.

Thus, polycide films with increased thermal stability have been described.

We claim:

1. A method of forming a polycide film, said method comprising the steps of:

forming a first silicon layer;

forming a barrier layer on said first silicon layer;

forming a second silicon layer on said barrier layer;

forming a metal layer on said second silicon layer;

forming a silicide layer by reacting said metal layer and said second silicon layer; and diffusing a dopant through said barrier layer to said first silicon layer.

2. The method of claim 1 wherein said barrier layer is silicon dioxide.

3. The method of claim 2 wherein said barrier layer is formed to a thickness between 5–25 Å.

4. The method of claim 1 wherein said first silicon layer and said second silicon layer are polycrystalline silicon.

5. The method of claim 1 wherein said first silicon layer and said second silicon layer are amorphous silicon.

6. The method of claim 1 wherein said barrier layer is formed to a thickness sufficient to prevent silicon from said first polysilicon layer from diffusing through said barrier layer during said silicide formation step.

7. The method of claim 1 wherein said metal layer is selected from the group consisting of: titanium, cobalt, palladium, nickel, and platinum.

8. The method of claim 1 wherein said step of forming said silicide utilizes a Rapid Thermal Process.

9. The method of claim 1 wherein said second silicon layer is substantially consumed during said silicide formation step.

10. The method of claim 1 wherein said metal layer is selected from the group consisting of titanium and cobalt, and wherein said silicide is formed at a temperature greater than 800° C.

11. The method of claim 1 wherein said metal layer is selected from the group consisting of palladium, nickel, and platinum, and said silicide is formed at a temperature greater than 700° C.

12. A method of forming a polycide gate electrode on a semiconductor substrate, said method comprising the steps of:

depositing a first polysilicon layer on a gate dielectric layer formed on a semiconductor substrate;

forming a 5–25 Å thick silicon dioxide layer on said first polysilicon layer;

depositing a second polysilicon layer on said thin oxide layer;

patterning said second polysilicon layer, said thin oxide layer, and said first polysilicon layer into a gate electrode;

forming spacers adjacent to the outside edges of said gate electrode;

depositing a metal layer over said substrate, said spacers, and said second polysilicon layer; and annealing said substrate so that said metal layer and said second polysilicon layer form a low resistance silicide layer.

13. The method of claim 12 further comprising the step of:

after forming said spacers, ion implanting impurities into said semiconductor substrate in alignment with the outside edges of said spacers, and into said gate electrode to form source/drain regions and to dope said gate electrode.

14. The method of claim 12 wherein said thin silicon dioxide layer is formed to a thickness between 10–20 Å.

15. The method of claim 12 wherein said thin silicon dioxide layer is formed to a thickness sufficient to prevent silicon atoms from said first polysilicon layer from diffusing through said thin oxide layer during said annealing step.

16. The method of claim 12 wherein said metal layer is selected from the group consisting of titanium, cobalt, palladium, nickel, and platinum.

17. The method of claim 12 wherein said second polysilicon layer and said metal layer are formed to thicknesses so that they are both substantially consumed into silicide during said annealing step.

18. The method of claim 12 wherein said thin silicon dioxide layer is formed by exposing said first polysilicon layer to an air ambient.

19. The method of claim 12 wherein said anneal comprises a Rapid Thermal Anneal.

20. The method of claim 12 wherein said gate electrode has a gate length of less than or equal to 0.25 microns.

21. The method of claim 12 wherein said first polysilicon layer is between 500–3000 Å thick and said silicide layer is approximately 500 Å thick.

22. The method of claim 12 wherein said first polysilicon layer is approximately four times thicker than said silicide layer.

23. A method of forming a polycide film, said method comprising the steps of:

forming a first silicon layer;

forming a passivating barrier layer having a thickness between 5–25 Å on said first silicon layer;

forming a second silicon layer on said passivating barrier layer;

forming a metal layer on said second silicon layer;

forming a silicide layer by reacting said metal layer and said second silicon layer, wherein said passivating barrier layer resists reaction of said metal layer with said first silicon layer.

24. A method of forming a polycide film, said method comprising the steps of:

forming a first silicon layer;

forming a barrier layer on said first silicon layer;

forming a second silicon layer on said barrier layer; and forming a silicide layer by reacting said metal layer and said second silicon layer, wherein said barrier layer has a thickness of between 5–25 Å and is selected from the group consisting of silicon dioxide, silicon oxynitride, and silicon nitride.

\* \* \* \* \*